(12) United States Patent
Kokame

(10) Patent No.: US 10,038,164 B2
(45) Date of Patent: Jul. 31, 2018

(54) METHOD OF MANUFACTURING A DISPLAY DEVICE AND A DISPLAY DEVICE

(71) Applicant: Japan Display Inc., Minato-ku (JP)

(72) Inventor: Hiraaki Kokame, Minato-ku (JP)

(73) Assignee: Japan Display Inc., Minato-ku (JP)

( * ) Notice: Subject to any disclaimer, the term of this patent is extended or adjusted under 35 U.S.C. 154(b) by 0 days.

(21) Appl. No.: 15/606,897

(22) Filed: May 26, 2017

(65) Prior Publication Data

US 2017/0373274 A1 Dec. 28, 2017

(30) Foreign Application Priority Data

Jun. 24, 2016 (JP) ................................ 2016-125310

(51) Int. Cl.
*H01L 51/52* (2006.01)
*H01L 27/32* (2006.01)

(52) U.S. Cl.
CPC ...... *H01L 51/5256* (2013.01); *H01L 27/3244* (2013.01)

(58) Field of Classification Search
CPC ............. H01L 51/5012; H01L 51/5256; H01L 51/5253; H01L 27/3244; H01L 27/3262; H01L 27/3246
See application file for complete search history.

(56) References Cited

U.S. PATENT DOCUMENTS

| 2015/0076456 A1* | 3/2015 | Choi ................... H01L 27/3267 257/40 |
| 2015/0091030 A1* | 4/2015 | Lee ..................... H01L 27/3246 257/91 |
| 2016/0372703 A1* | 12/2016 | Khachatryan ....... H01L 51/5253 |

FOREIGN PATENT DOCUMENTS

| JP | 2007-250370 | 9/2007 |
| JP | 2015-176717 | 10/2015 |

* cited by examiner

*Primary Examiner* — Jasmine Clark
(74) *Attorney, Agent, or Firm* — Oblon, McClelland, Maier & Neustadt, L.L.P.

(57) ABSTRACT

A method of manufacturing a display device, includes steps of forming a first inorganic film, forming a first organic film so as to cover the first inorganic film, removing a part of the first organic film, forming a second inorganic film so as to cover the first inorganic film and a region of the first organic film that has not been removed in the step of removing the part of the first organic film, forming a second organic film so as to cover the second inorganic film, removing a part of the second organic film, and forming a third inorganic film so as to cover the second inorganic film and a region of the second organic film that has not been removed in the step of removing the part of the second organic film. A thickness of the first organic film is different from that of the second organic film.

6 Claims, 10 Drawing Sheets

METHOD OF MANUFACTURING A DISPLAY DEVICE AND A DISPLAY DEVICE

CROSS-REFERENCE TO RELATED APPLICATION

The present application claims priority from the Japanese Application JP2016-125310 filed on Jun. 24, 2016, the content of which is hereby incorporated by reference into this application.

BACKGROUND OF THE INVENTION

1. Field of the Invention

The present invention relates to a manufacturing method of a display device and a display device.

2. Description of the Related Art

Recent years, a display device such as an organic EL display device using an organic EL (Electro-Luminescent) element and a liquid crystal display device has been put into practical use. However, an organic EL element is susceptible to moisture, and therefore there is a fear that an organic EL element deteriorates due to moisture and a lighting defect such as a dark spot is generated. Further, on a liquid crystal display device as well, a problem arises that a characteristics of a thin film transistor changes influenced by moisture that has infiltrated therein, and a display quality deterioration occurs. Therefore, a display device needs to be sealed off in order to prevent a infiltration of moisture and the like into the display device.

However, if a foreign substance is mixed into a sealing film during its formation, there is a fear that a defect is generated on the sealing film, and a display quality deteriorates due to moisture or the like that has infiltrated therein from the defect. Therefore, Japanese Patent Application Laid-Open No. 2015-176717, for example, discloses forming a sealing film with high coverage rate as to a foreign substance by using the ALD (Atomic Layer Deposition) method with which molecules are deposited layer by layer and a very thin sealing film is isotropically formed to form a sealing film.

Further, for example, Japanese Patent Application Laid-Open No. 2007-250370 discloses providing, in advance when a sealing film is laminated, a foreign substance covering part and a bend smoothing part at a bend such as a substance that exists on a surface that forms a sealing film and a border between a horizontal surface and an inclined surface to smooth roughness and a bend, and as a result preventing a defect generation on a sealing film formed thereon.

SUMMARY OF THE INVENTION

It is difficult to cover a large foreign substance in the case where a sealing film is formed using the ALD method as in Japanese Patent Application Laid-Open No. 2015-176717.

Further, even in the case to provide a bend smoothing part as in Japanese Patent Application Laid-Open No. 2007-250370, if there exist foreign substances of different sizes, it is difficult to smooth bends due to the variation in size of the respective foreign substances.

That is, in the case where a bend smoothing part is formed to have a thickness in accordance with a large foreign substance, when removing a bend smoothing part formed on a planar part, all of bend smoothing parts formed around small foreign substances are removed. Meanwhile, in the case where a bend smoothing part is formed to have a thickness in accordance with a small foreign substance, it would be difficult to smooth a bend due to a large foreign substance. Therefore, a defect on the sealing film is generated at a part where the bend is not smoothed.

Accordingly, in the configuration where a foreign substance is sealed with a single sealing film, bends of different sizes due to foreign substances of different sizes cannot be smoothed.

The present invention has been made in view of the above problem, and the object thereof is to provide a display device that prevents intrusions of impurities from the outside even when foreign substances of different sizes get into it.

According to another aspect of the present invention, a method of manufacturing a display device including a plurality of pixels, includes steps of forming a first inorganic film, forming a first organic film so as to cover the first inorganic film, removing a part of the first organic film, forming a second inorganic film so as to cover the first inorganic film and a region of the first organic film that has not been removed in the step of removing the part of the first organic film, forming a second organic film so as to cover the second inorganic film, removing apart of the second organic film, and forming a third inorganic film so as to cover the second inorganic film and a region of the second organic film that has not been removed in the step of removing the part of the second organic film. A thickness of the first organic film is different from that of the second organic film.

In one embodiment of the present invention, the method of manufacturing a display device further includes a step of forming a rib at a peripheral part of the pixels. The first inorganic film is formed over the rib.

In one embodiment of the present invention, one of the first organic film and the second organic film is formed to have a thickness of 70 nm to 500 nm, and the other one is formed to have a thickness of 0.8 µm to 3.0 µm.

In one embodiment of the present invention, the first organic film is formed to be thinner than a thickness of the rib. The second organic film is formed to be planarized by filling a convex part constituted by a horizontal surface and an inclined surface of the second inorganic film. The part of the second organic film is removed so that an upper surface of the second organic film is positioned lower than that of the second inorganic film over a top surface of the rib.

In one embodiment of the present invention, the first organic film is formed to planarize a concave part constituted by a horizontal surface and an inclined surface of the first inorganic film by filling it. The part of the first organic film is removed so that an upper surface of the first organic film is positioned lower than that of the first inorganic film over a top surface of the rib. The second organic film is formed to be thinner than a thickness of the rib.

In one embodiment of the present invention, the step of removing the part of the first organic film or the step of removing the part of the second organic film is performed so as to comprise ashing.

According to one aspect of the present invention, a display device that includes a plurality of pixels, includes a rib formed at a peripheral part of the pixels, a first inorganic film formed over the rib, a first organic film formed so as to be in contact with the first inorganic film in a region over a vicinity of a border between a horizontal surface and an inclined surface of the rib, a second inorganic film formed so as to cover the first inorganic film and the first organic film, a second organic film formed so that its upper surface is positioned lower than that of the second inorganic film over a top surface of the rib and that its upper surface is formed to be planarized by filling a concave part constituted by a horizontal surface and an inclined surface of the second inorganic film, and a third inorganic film formed so as to cover the second inorganic film and the second organic film. The second organic film is formed to be thicker than the first organic film.

According to one aspect of the present invention, a display device that includes a plurality of pixels, includes a rib formed at a peripheral part of the pixels, a first inorganic film formed over the rib, a first organic film formed so that its upper surface is positioned lower than that of the first inorganic film over a top surface of the rib and that its upper surface is formed to be planarized by filling a concave part constituted by a horizontal surface and an inclined surface of the first inorganic film, a second inorganic film formed so as to cover the first inorganic film and the first organic film, a second organic film formed so as to be in contact with the second inorganic film in a region over a vicinity of a border between a horizontal surface and an inclined surface of the rib, and a third inorganic film formed so as to cover the second inorganic film and the second organic film. The first organic film is formed to be thicker than the second organic film.

DETAILED DESCRIPTION OF THE INVENTION

Figure 1:
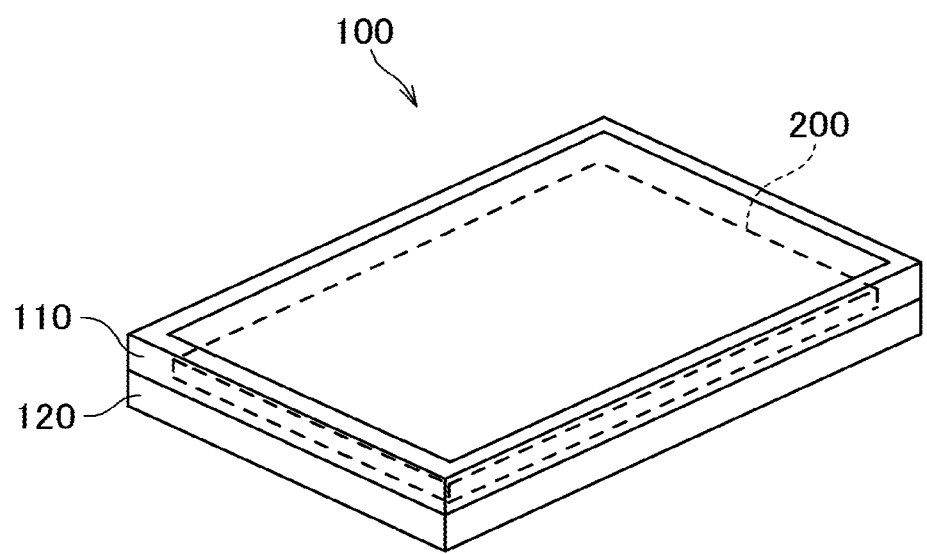
FIG. 1 is a diagram schematically illustrating a display device according to an embodiment of the present invention.

Below, the respective embodiments of the present invention are explained with reference to the accompanying drawings. While the width, thickness, shape, and the like of each part in the drawings may be illustrated schematically as compared with the actual embodiments in order to clarify the explanation, these are merely examples and an interpretation of the present invention should not be limited thereto. Furthermore, in the specification and the respective drawings, the same reference symbols may be applied to elements similar to those that have already been illustrated in another drawing and a detailed explanation of such elements may be omitted as appropriate.

FIG. 1 is a diagram schematically illustrating a display device 100 according to an embodiment of the present invention. As illustrated in the figure, the display device 100 is composed of a display panel 200 that is fixed so as to be held between an upper frame 110 and a lower frame 120.

Figure 2:
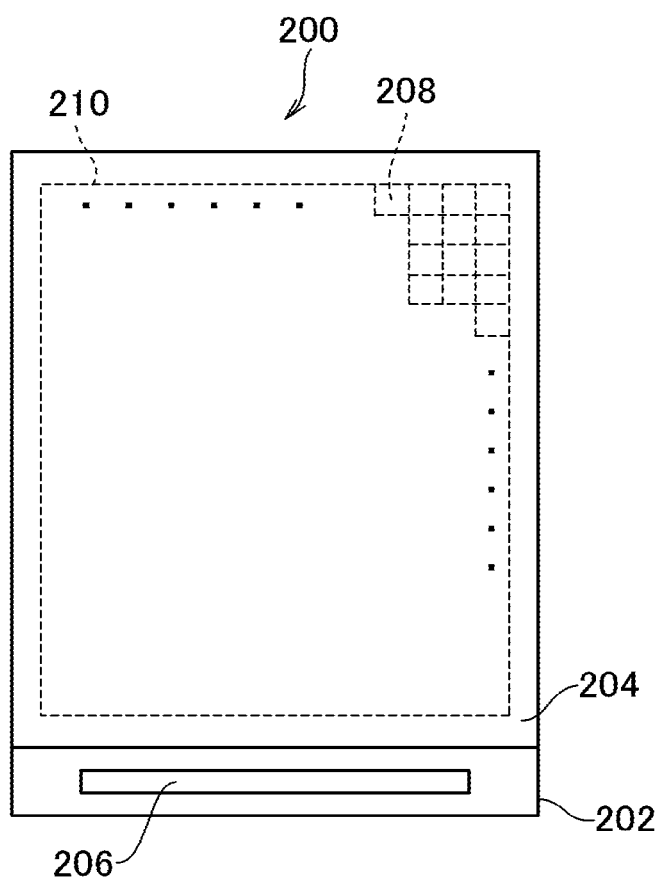
FIG. 2 is a diagram schematically illustrating a display panel.

FIG. 2 is a schematic diagram illustrating the configuration of the display panel 200 of FIG. 1. As illustrated in FIG. 2, the display panel 200 includes an array substrate 202, a protecting film 204, and a driving IC (Integrated Circuit) 206. On the array substrate 202, a light emitting layer 308, and a sealing film 320 or the like to be described later that prevents intrusions of impurities into the light emitting layer 308 are formed.

The driving IC 206, for example, applies an electric potential to a scanning signal line of a pixel 208 transistor that is located in each pixel 208 for connecting a source and a drain and at the same time applies a current that corresponds to a gradation value of the pixel 208 to each pixel transistor data signal line. By the driving IC 206 the display panel 200 displays a color image constituted by a plurality of pixels 208 composed of a plurality of colors in a display region 210.

The protecting film 204 is an acrylic film to protect the display panel 200 from external damages, and is bonded to the array substrate 202 with adhesive.

[First Embodiment]

Figure 3:
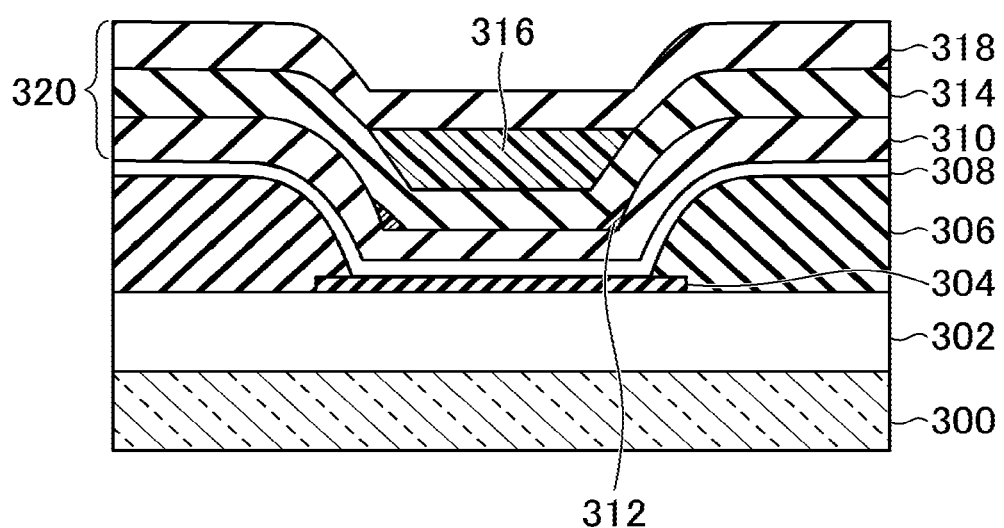
FIG. 3 is an example schematically illustrating a lamination structure of a display panel in a first embodiment.

FIG. 3 is an example of a diagram schematically illustrating a cross section of the display region 210 in the first embodiment. As illustrated in FIG. 3, the display panel 200 includes a substrate 300, an array layer 302, an anode electrode 304, a rib 306, a light emitting layer 308, a first inorganic film 310, a first organic film 312, a second inorganic film 314, a second organic film 316, and a third inorganic film 318.

The sealing film 320 that prevents intrusions of impurities from the outside is formed by laminating the first inorganic film 310, the first organic film 312, the second inorganic film 314, the second organic film 316, and the third inorganic film 318.

The substrate 300 is, for example, a glass substrate, but may also be a flexible substrate formed of resin. The array layer 302 includes a pixel transistor formed to include a source electrode, a drain electrode, a gate electrode, a semiconductor layer, and the like. The pixel transistor is formed in each pixel 208 and controls a luminance of light that the pixel 208 emits. A detailed structure of the array layer 302 is not explained here as it is similar to that of the conventional technology.

The anode electrode 304 is formed so as to be connected electrically to the pixel transistor. Specifically, for example, the anode electrode 304 is formed on an upper layer side of the source electrode or the drain electrode, so as to be connected electrically to the source electrode or the drain electrode of the pixel transistor included in the array layer 302 in the display region 210.

The rib 306 is formed at a peripheral part of the pixel electrode 208. Specifically, for example, as in FIG. 3, it is formed of a resin material on an upper layer side of the array layer 302 and the end of the anode electrode 304. The rib 306 can prevent short circuiting of the anode electrode 304 and the cathode electrode.

The light emitting layer 308 is formed on the anode electrode 304 and emits light. Specifically, for example, the light emitting layer 308 is formed by laminating a hole injection layer, a hole transporting layer, an EL layer, an electron injection layer, an electron transporting layer, and a cathode electrode on the anode electrode 304 and the rib 306. The EL layer emits light due to a recombination of holes injected from the anode electrode 304 and electrons injected from the cathode electrode. The hole injection layer, the hole transporting layer, the electron injection layer, and the electron transporting layer are similar to those of the conventional technology, and thus the explanation thereof is skipped.

The first inorganic film 310 is formed over the rib 306. Specifically, for example, the first inorganic film 310 is formed over the rib 306 so as to cover the light emitting layer 308. Note that the first inorganic film 310 is formed of an inorganic material such as SiN for preventing intrusions of impurities into the light emitting layer 308.

The first organic film 312 is formed so as to be in contact with the first inorganic film 310 in a region over the vicinity of the border between the horizontal surface and the inclined surface of the rib 306. Specifically, for example, the first organic film 312 is formed at the end of the inclined surface formed on the first inorganic film 310, in a region over the edge of the rib 306. Note that the first organic film 312 is preferably formed, for example, using an organic material such as acryl to have a thickness of 70 nm to 500 nm, especially to have a thickness of 90 nm.

The second inorganic film 314 is formed so as to cover the first inorganic film 310 and the first organic film 312. Specifically, for example, the second inorganic film 314 is formed so as to cover the first inorganic film 310 and the first organic film 312 formed at the end of the inclined surface of the first inorganic film 310. Here, the second inorganic film 314 is, as the first inorganic film 310, formed of an inorganic material such as SiN that prevents intrusions of impurities into the light emitting layer 308.

The second organic film 316 is formed so that its upper surface is positioned lower than that of the second inorganic film 314 over the top surface of the rib 306 and that its upper surface becomes planar by filling a concave part formed by the horizontal surface and the inclined surfaces of the second inorganic film 314. Specifically, for example, the second organic film 316 is formed between the two inclined surfaces of the second inorganic films 314 that are next to each other and sandwich a section where the anode electrode 304 is formed. However, here, since the second inorganic film 314 is formed in accordance with the shape of the rib 306, and over the bottom of the concave shaped part of the second inorganic films 314 the upper surface of the second organic film 316 is formed at a position higher than that of the second inorganic film 314.

Note that the second organic film 316 is formed to be thicker than the first organic film 312. Specifically, for example, the second organic film 316 is formed to have a thickness of 0.8 µm to 3 µm.

The third inorganic film 318 is formed so as to cover the second inorganic film 314 and the second organic film 316. Specifically, for example, the third inorganic film 318 is formed so as to cover the second inorganic film 314 and the second organic film 316.

Figure 4A:
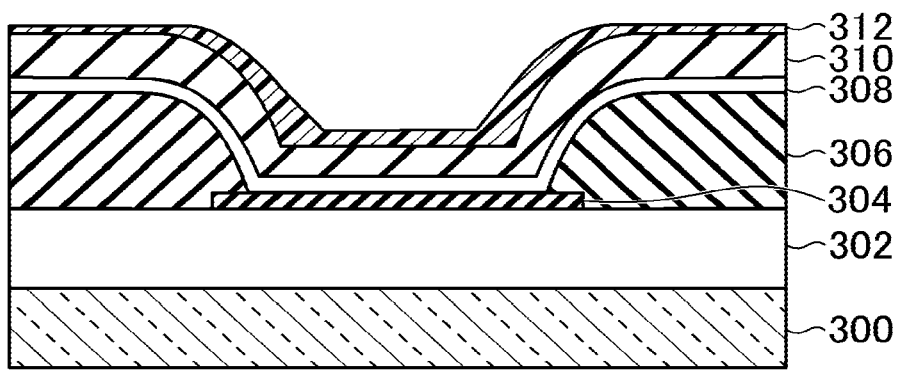
FIG. 4A is a diagram for illustrating a step to form the display panel in the first embodiment.

Subsequently, a manufacturing method of the display device 100 in the first embodiment is explained. Firstly, as illustrated in FIG. 4A, the array layer 302 and the anode electrode 304 are formed on the substrate 300. The step to form the array layer 302 and the anode electrode 304 is similar to that in the conventional technology, and the explanation thereof is skipped.

Next, the rib 306 is formed at the peripheral part of the pixel 208. Specifically, the rib 306 is formed on the upper layer side of the array layer 302 and the end of the anode electrode 304. Then, on the upper layer side of the anode electrode 304 and the rib 306, the light emitting layer 308 and the first inorganic film 310 are formed in order.

Further, the first organic film 312 is formed so as to cover the first inorganic film 310. Specifically, the first organic film 312 is formed to be thinner than the thickness of the rib 306 so that the first inorganic film 310 is covered and the inclined surface of the first inorganic film 310 generated due to the rib 306 is remained.

Figure 4B:
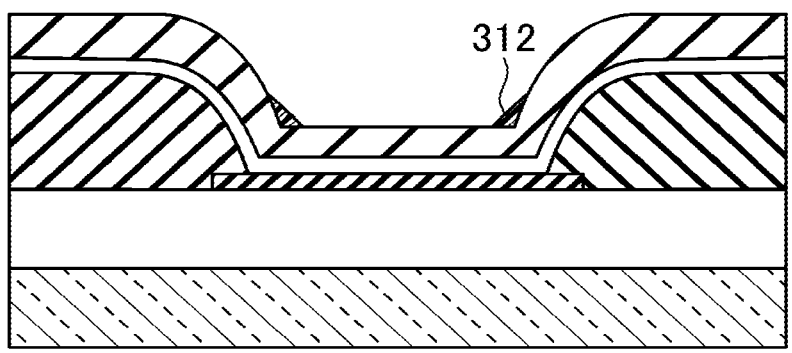
FIG. 4B is a diagram for illustrating a step to form the display panel in the first embodiment.

Next, as illustrated in FIG. 4B, a part of the first organic film 312 is removed. Specifically, the first organic film 312 formed in the region over the top surface of the rib 306 is removed by a method such as plasma ashing. That is, in the case where the first organic film 312 of 70 nm to 500 nm is to be formed, plasma ashing is performed so that the first organic film 312 is chipped away so as to have a thickness of 70 nm to 500 nm.

As a result, the first organic film 312 is left only at the end of the inclined surface formed on the first inorganic film 310 in a region over the edge of the rib 306. The left first organic film 312 has the thickness of 70 nm to 500 nm.

Figure 4C:
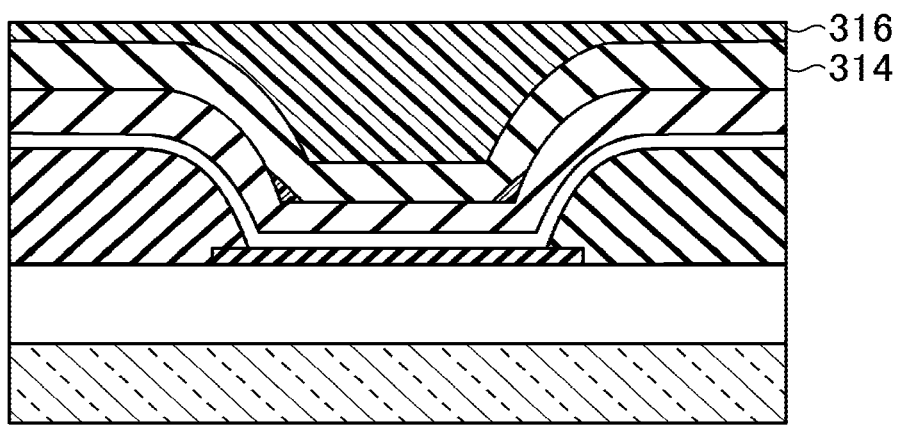
FIG. 4C is a diagram for illustrating a step to form the display panel in the first embodiment.

Next, as illustrated in FIG. 4C, the second inorganic film 314 is formed so as to cover the first inorganic film 310 and a region of the first organic film 312 that has not been removed in the step of removing a part of the first organic film 312. Specifically, the second inorganic film 314 is formed so as to cover the first organic film 312 left only at the end of the inclined surface formed on the first inorganic film 310 and the first inorganic film 310.

Then, the second organic film 316 is formed so as to cover the second inorganic film 314. Specifically, the second organic film 316 is formed so as to fill the concave part constituted by the horizontal surface and the inclined surface of the second inorganic film 314 for planarizing. That is, the second organic film 316 formed to be thicker than the first organic film 312.

Figure 5A:
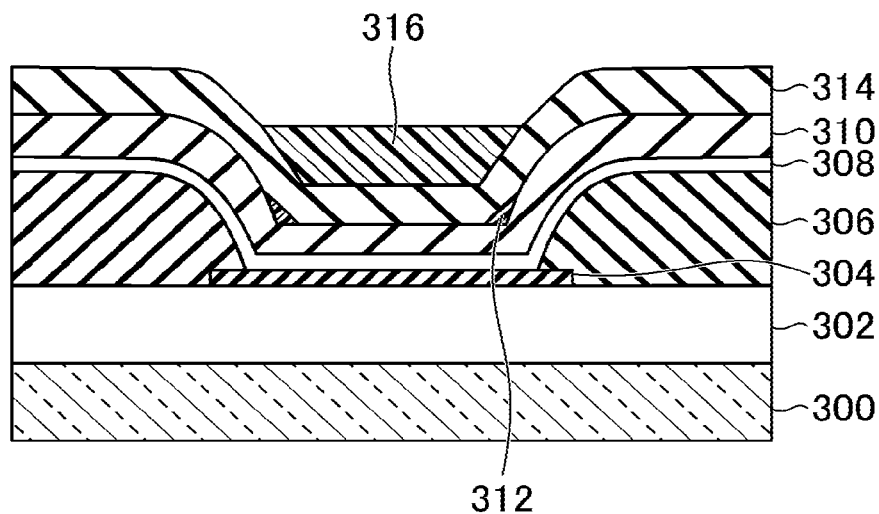
FIG. 5A is a diagram for illustrating a step to form the display panel in the first embodiment.

Next, as illustrated in FIG. 5A, a part of the second organic film 316 is removed. Specifically, the second organic film 316 is subjected to ashing so that its upper surface is positioned lower than that of the second inorganic film 314 over the top surface of the rib 306. Here, the second organic film 316 formed in the region over the top surface of the protruding shaped part of the rib 306 is removed by the same method of ashing as in the case of the first organic film 312. That is, in the case where 1 µm of the second organic film 316 is formed in the region over the top surface of the rib 306, the ashing is performed so that the second organic film 316 is chipped away so as to have a thickness of 1.0 µm to 1.1 µm.

As a result, the second organic film 316 is left only between the two inclined surfaces of the second inorganic films 314 formed over the edges of the ribs 306 that sandwich the anode electrode 304.

Figure 5B:
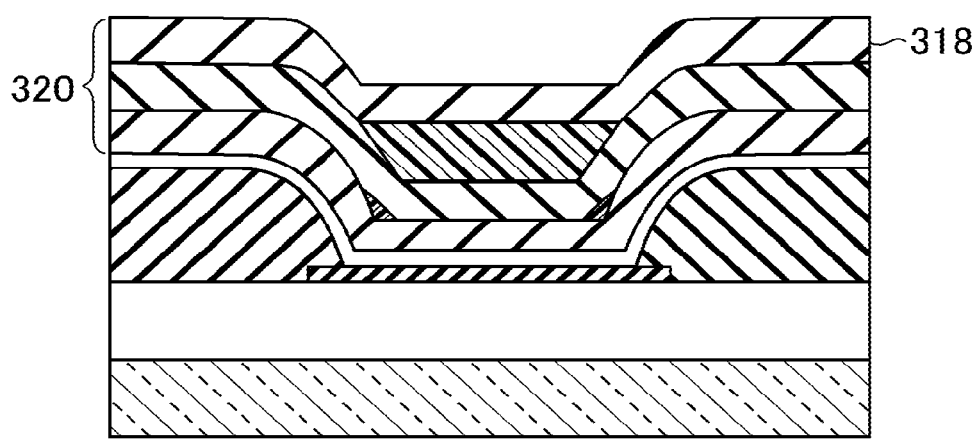
FIG. 5B is a diagram for illustrating a step to form the display panel in the first embodiment.

Next, as illustrated in FIG. 5B, the third inorganic film 318 is formed so as to cover the second organic film 316. Specifically, the third inorganic film 318 is formed so as to cover the second inorganic film 314 and the second organic film 316.

As seen above, by forming the sealing film 320 including the thin first organic film 312 on the lower layer side and the thick second organic film 316 on the upper layer side, any size of a foreign substance 600 can be covered by the sealing film 320 even in the case where there exist foreign substances 600 of different sizes. Accordingly, intrusions of impurities from the outside can be prevented.

Figure 6A:
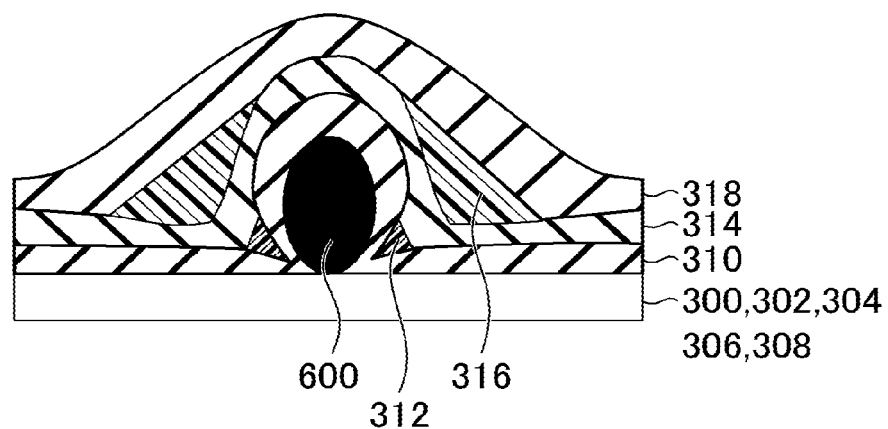
FIG. 6A is a diagram for illustrating a case where there is an intrusion of a large foreign substance in the first embodiment.

Below, the structure of the sealing film 320 in the case where foreign substances 600 of different sizes exist in this embodiment is explained. FIG. 6A is a diagram illustrating the structure of the sealing film 320 in the case where a large foreign substance 600 exists. For a brevity of the explanation, the array layer 302, the anode electrode 304, the rib 306, and the light emitting layer 308 are not illustrated in FIGS. 6A and 6B.

As illustrated in FIG. 6A, a foreign substance 600 of a size equal to or larger than 10 µm is attached onto the surface of the cathode electrode. The first inorganic film 310 is formed on the lateral surface and the top part of the foreign substance 600, and the planar part to which the foreign substance 600 is not attached. Note that while the first inorganic film 310 covers the foreign substance 600 in the figure, since the size of the foreign substance 600 is larger than the thickness of the first inorganic film 310, there is a fear that the foreign substance 600 cannot be sufficiently covered, and a defect is generated.

The first organic film 312 is formed at the end of the inclined surface formed on the first inorganic film 310. Specifically, the first organic film 312 is formed at the end of the inclined surface formed on the first inorganic film 310 due to the foreign substance 600 to have a thickness of around 90 nm. In the case where a defect is generated on the first inorganic film 310, since the thickness of the first organic film 312 is small as compared with the size of the foreign substance 600, the first organic film 312 cannot cover the defect.

The second inorganic film 314 is formed on the upper layer side of the first organic film 312. Specifically, the second inorganic film 314 is formed on the upper layer side of the first organic film 312 left only at the end of the inclined surface of the first inorganic film 310 and the first inorganic film 310. As the first inorganic film 310, the second inorganic film 314 is sufficiently smaller than the foreign substance 600, there is a fear that a defect is generated also on the second inorganic film 314.

The second organic film 316 is formed on a region of the second inorganic film 314 where the inclined surface is formed. Specifically, the second organic film 316 is formed so as to planarize the bump of the second inorganic film 314. Then, the second organic film 316 formed on the planar part is removed by ashing to be left on the region of the second inorganic film 314 where the inclined surface is formed.

Here, the second organic film 316 has a thickness around 1 µm, and thus forms an inclined surface so gentle that a defect is not generated on the third inorganic film 318 formed on the second organic film 316.

The third inorganic film 318 is formed so as to cover the second organic film 316. Specifically, the third inorganic film 318 is formed so as to cover the second inorganic film 314 and the second organic film 316 formed on the inclined surface of the second inorganic film 314. Here, the third inorganic film 318 can be formed without generating a defect due to the foreign substance 600 since the base of the third inorganic film 318 is formed to incline gently due to the second organic film 316.

Figure 6B:
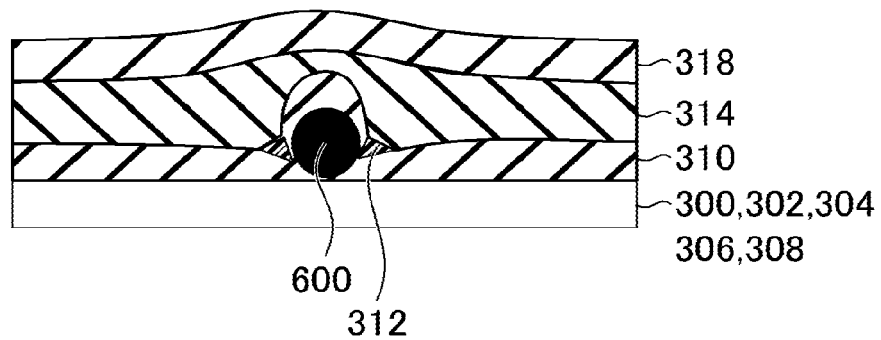
FIG. 6B is a diagram for illustrating a case where there is an intrusion of a small foreign substance in the first embodiment.

Subsequently, the structure of the sealing film 320 in the case where there exists a small foreign substance 600 is explained with reference to FIG. 6B. As illustrated in FIG. 6B, a foreign substance 600 of a size equal to or smaller than 4 µm is attached onto the surface of the cathode electrode.

Then, the first inorganic film 310 is formed on the lateral surface and the top part of the foreign substance 600 and a planar part to which the foreign substance 600 is not attached. In the figure, while the first inorganic film 310 covers the foreign substance 600, the size of the foreign substance 600 is larger than the thickness of the first inorganic film 310. Thus there is a fear that the first inorganic film 310 cannot sufficiently cover the foreign substance 600, and a defect is generated.

The first organic film 312 is formed at the end of the inclined surface formed on the first inorganic film 310. Specifically, the first organic film 312 is formed at the end of the inclined surface formed on the first inorganic film 310 due to the foreign substance 600 to have a thickness around 90 nm.

In the step of ashing the first organic film 312, ashing is performed in a short period of time so as to chip away the thinly formed first organic film 312, and thus the first organic film 312 formed at the end of the inclined surface of the first inorganic film 310 is left. Further, the thickness of the first organic film 312 is large enough to cover a defect of the first inorganic film 310 generated due to the small foreign substance 600, and thus the foreign substance 600 is covered by the first inorganic film 310 or the first organic film 312.

The second inorganic film 314 is formed so as to cover the first inorganic film 310 and the first organic film 312. Specifically, since the base of the second inorganic film 314 is gently inclined due to the first organic film 312, the second inorganic film 314 is formed to be substantially planarized.

The second organic film 316 is formed on the second inorganic film 314, and is thereafter removed by ashing. Specifically, although the second organic film 316 is formed on the second inorganic film 314, since the second inorganic film 314 is formed to be substantially planarized, the second organic film 316 is removed by ashing. The third inorganic film 318 is formed so as to cover the second inorganic film 314.

As seen above, even in the case where foreign substances 600 of different sizes exist, and a bump due to a large foreign substance 600 is made to be gentle by the second organic film 316, and a bump due to a small foreign substance 600 is made to be gentle by the first organic film 312. Therefore, a generation of a defect on the second inorganic film 314 or the third inorganic film 318 can be prevented.

[Second Embodiment]

As to the first embodiment, the case has been explained where the first organic film 312 formed on the lower layer side is formed to be thinner than the second organic film 316 formed on the upper layer side, but it may be configured that the first organic film 312 is formed to be thicker than the second organic film 316. Below, a second embodiment is explained. The explanation of the configurations similar to those of the first embodiment is skipped.

Figure 7:
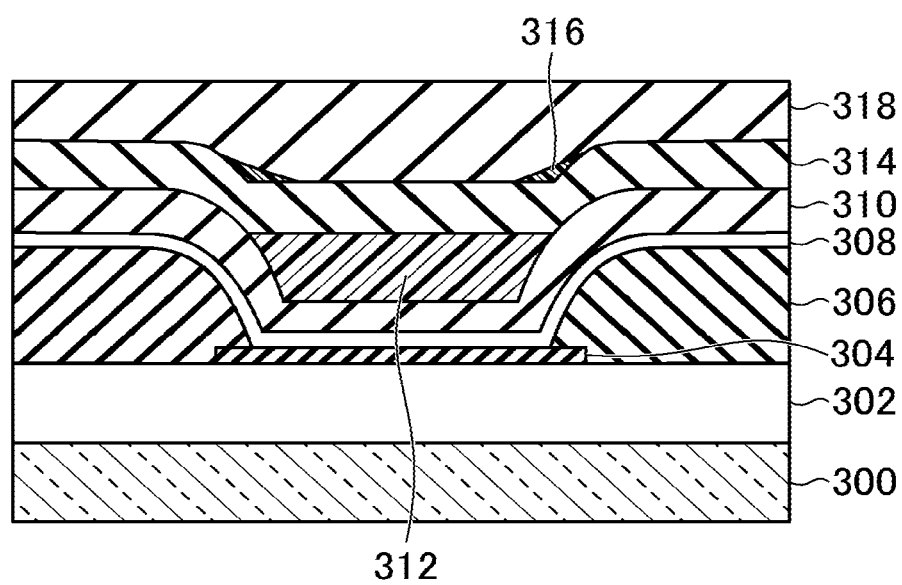
FIG. 7 is an example schematically illustrating a lamination structure of a display panel in a second embodiment.

FIG. 7 is an example of a diagram schematically illustrating a cross section of the display region 210 in the second embodiment. As illustrated in FIG. 7, the display panel 200 includes the substrate 300, the array layer 302, the anode electrode 304, the rib 306, the light emitting layer 308, the first inorganic film 310, the first organic film 312, the second inorganic film 314, the second organic film 316, and the third inorganic film 318. The substrate 300, the array layer 302, the anode electrode 304, the rib 306, the light emitting layer 308, and the first inorganic film 310 are similar to those in the first embodiment.

The first organic film 312 is formed so that its upper surface is positioned lower than that of the first inorganic film 310 over the top surface of the rib 306 and that its upper surface is formed to be planarized by filling the concave part constituted by the horizontal surface and the inclined surfaces of the first inorganic film 310. Specifically, for example, the first organic film 312 is formed between the two inclined surfaces of the first inorganic films 310 that are next to each other and sandwich a section where the anode electrode 304 is formed. Note that preferably the first organic film 312 is formed to have a thickness of around 0.8 μm to 3 μm.

The second inorganic film 314 is formed so as to cover the first inorganic film 310 and the first organic film 312. Specifically, for example, the second inorganic film 314 is formed so as to cover the first inorganic film 310 and the first organic film 312 formed over the anode electrode 304.

The second organic film 316 is formed so as to be in contact with the second inorganic film 314 in a region over the vicinity of the border between the horizontal surface and the inclined surface of the rib 306. Specifically, for example, the second organic film 316 is formed at the end of the inclined surface formed on the second inorganic film 314, in a region over the edge of the rib 306.

Note that the second organic film 316 is formed to be thinner than the first organic film 312. Specifically, for example, the second organic film 316 is preferably formed to have a thickness of 70 nm to 500 nm, especially a thickness of 90 nm.

The third inorganic film 318 is formed so as to cover the second inorganic film 314 and the second organic film 316. Specifically, for example, the third inorganic film 318 is formed so as to cover the second inorganic film 314 and the second organic film 316.

Figure 8A:
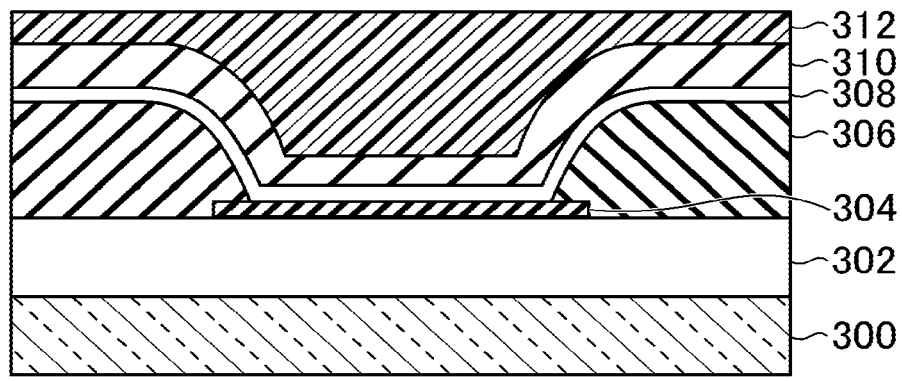
FIG. 8A is a diagram for illustrating a step to form the display panel in the second embodiment.

Subsequently, a manufacturing method of the display device 100 in the second embodiment is explained. Firstly, as illustrated in FIG. 8A, the array layer 302 to the first inorganic film 310 are formed on the glass substrate. This step is similar to that of the first embodiment.

After the first inorganic film 310 is formed, the first organic film 312 is formed so as to cover the first inorganic film 310. Specifically, the first organic film 312 is formed so as to be planarized by filling the concave part constituted by the horizontal surface and the inclined surface of the first inorganic film 310.

Figure 8B:
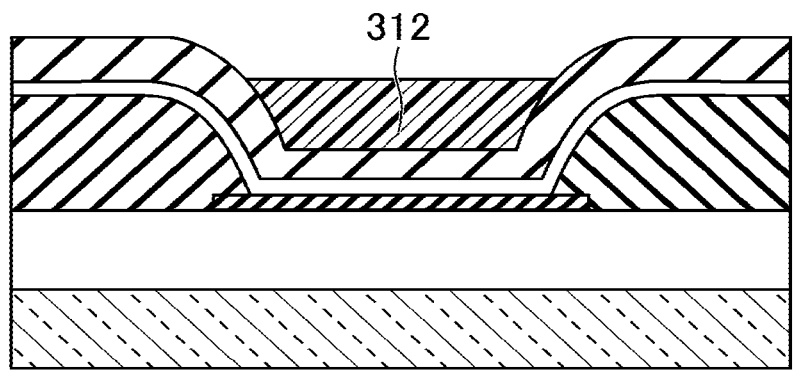
FIG. 8B is a diagram for illustrating a step to form the display panel in the second embodiment.

Next, as illustrated in FIG. 8B, a part of the first organic film 312 is removed. Specifically, the first organic film 312 is subjected to ashing so that its upper surface is positioned lower than that of the first inorganic film 310 over the top surface of the rib 306. For example, the ashing is performed to make the first organic film 312 have a thickness around 0.8 μm to 3.0 μm.

Figure 8C:
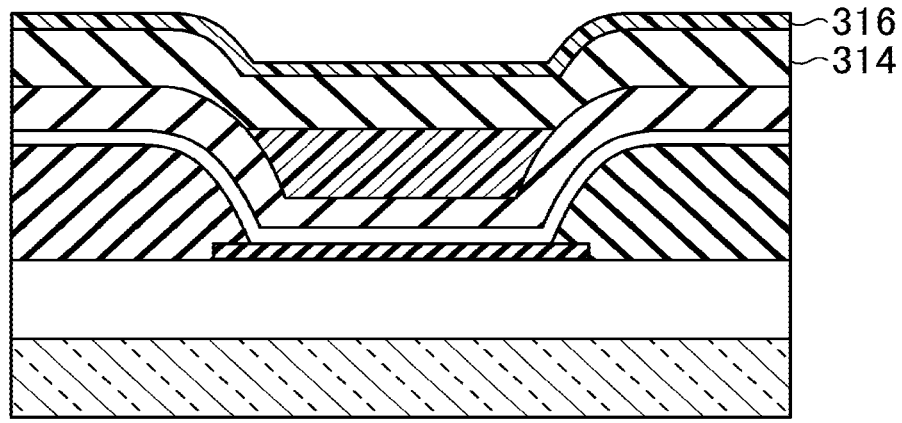
FIG. 8C is a diagram for illustrating a step to form the display panel in the second embodiment.

Next, as illustrated in FIG. 8C, the second inorganic film 314 is formed so as to cover the first inorganic film 310 and the first organic film 312. Then, the second organic film 316 is formed so as to cover the second inorganic film 314. Specifically, the second organic film 316 is formed to be thinner than the thickness of the rib 306 so that the second inorganic film 314 is covered and the bump of the second inorganic film 314 generated due to the rib 306 remains.

Figure 9A:
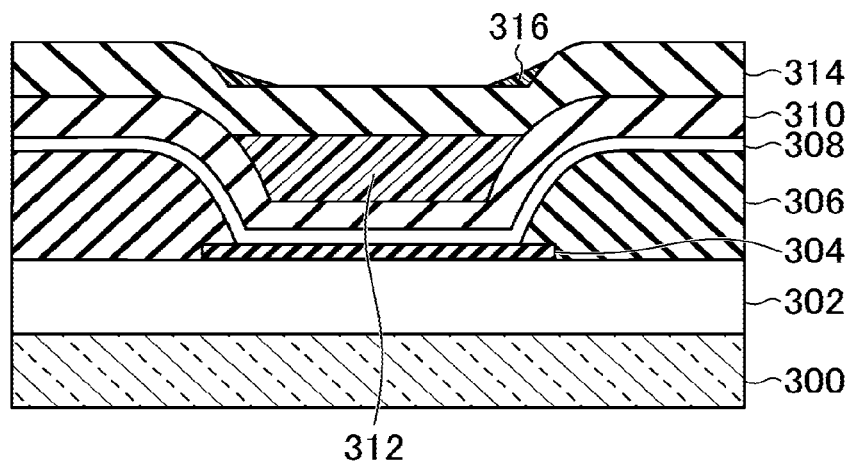
FIG. 9A is a diagram for illustrating a step to form the display panel in the second embodiment.

Next, as illustrated in FIG. 9A, a part of the second organic film 316 is removed. Specifically, the ashing is performed so that the second organic film 316 formed in a region over the top surface of the protruding shaped part of the rib 306 is not left.

As a result, the second organic film 316 is left only at the end of the inclined surface formed on the second inorganic film 314 in a region over the edge of the rib 306. The left second organic film 316 has a thickness of 70 nm to 500 nm.

Figure 9B:
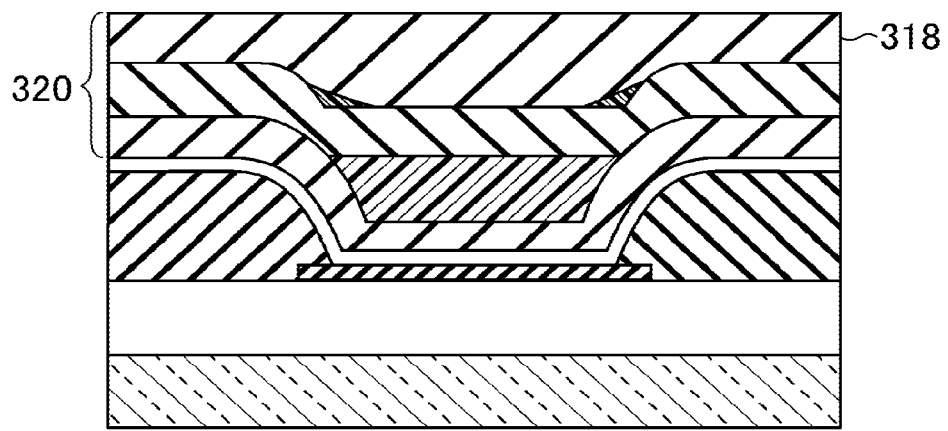
FIG. 9B is a diagram for illustrating a step to form the display panel in the second embodiment.

Next, as illustrated in FIG. 9B, the third inorganic film 318 is formed so as to cover the second organic film 316. Specifically, the third inorganic film 318 is formed so as to cover the second inorganic film 314 and the second organic film 316.

As seen above, even in the case where there exist foreign substances 600 of different sizes, any size of a foreign substance 600 can be covered by the sealing film 320, by forming the sealing film 320 including the thick first organic film 312 on the lower layer side and the thin second organic film 316 on the upper layer side.

Figure 10A:
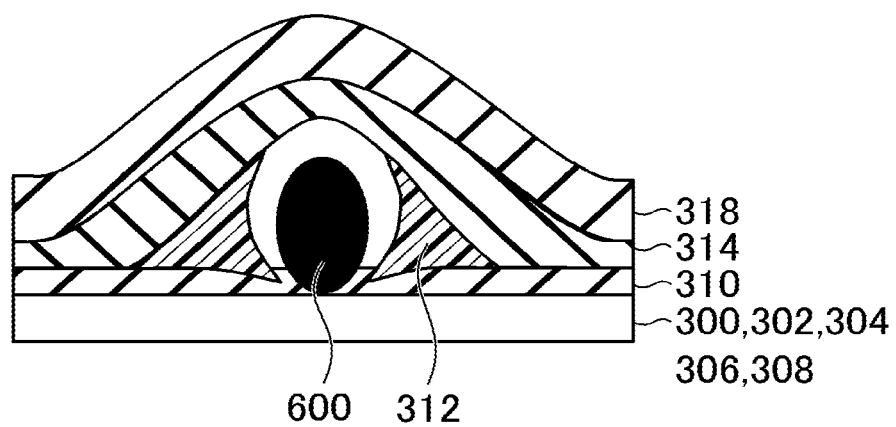
FIG. 10A is a diagram for illustrating a case where there is an intrusion of a large foreign substance in the second embodiment.

Below, the structure of the sealing film 320 in the case where foreign substances 600 of different sizes exist in this embodiment is explained. FIG. 10A is a diagram illustrating the structure of the sealing film 320 in the case where a large foreign substance 600 exists. For a brevity of the explanation, the array layer 302, the anode electrode 304, the rib 306, and the light emitting layer 308 are not illustrated in FIGS. 10A and 10B.

As illustrated in FIG. 10A, a foreign substance 600 of a size around 10 μm is attached onto the surface of the cathode electrode. The first inorganic film 310 is formed on the lateral surface and the top surface of the foreign substance 600, and the planar part to which the foreign substance 600 is not attached. Further, as in the first embodiment, although the first inorganic film 310 covers the foreign substance 600 in the figure, since the size of the foreign substance 600 is larger than the thickness of the first inorganic film 310, there is a fear that the foreign substance 600 cannot be sufficiently covered, and a defect is generated.

The first organic film 312 is formed in a region where the inclined surface of the first inorganic film 310 is formed. Specifically, the first organic film 312 is formed so as to planarize the bump of the first inorganic film 310, and after that the first organic film 312 formed on the planar part is removed by ashing. Therefore, the first organic film 312 is left in the region where the inclined surface of the first inorganic film 310 is formed.

Here, the first organic film 312 has a thickness around 1 μm, and thus forms an inclined surface so gentle that a defect is not generated on the second inorganic film 314 formed on the first organic film 312.

The second inorganic film 314 is formed so as to cover the first inorganic film 310 and the first organic film 312. Here, the second inorganic film 314 can be formed without generating a defect due to the foreign substance 600 since the base of the second inorganic film 314 is formed to incline gently due to the first organic film 312.

The second organic film 316 is formed on the second inorganic film 314, and is thereafter removed by ashing. Specifically, although the second organic film 316 is formed on the second inorganic film 314, since the second inorganic film 314 is formed to be substantially planarized, it is removed by ashing. The third inorganic film 318 is formed so as to cover the second inorganic film 314.

Figure 10B:
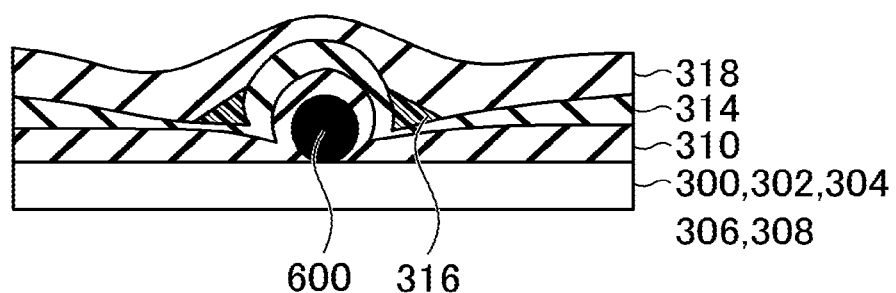
FIG. 10B is a diagram for illustrating a case where there is an intrusion of a small foreign substance in the second embodiment.

Subsequently, the structure of the sealing film 320 in the case where there exists a small foreign substance 600 is explained with reference to FIG. 10B. As illustrated in FIG.

10B, a foreign substance 600 of a size equal to or smaller than 4 μm is attached onto the surface of the cathode electrode.

The first inorganic film 310 is formed on the lateral surface and the top part of the foreign substance 600 and a planar part to which the foreign substance 600 is not attached. Further, as in the first embodiment, there is a fear that a defect is generated on the first inorganic film 310.

The first organic film 312 is formed on the first inorganic film 310, and is thereafter removed by ashing. Specifically, although the first organic film 312 is formed on the first inorganic film 310, since the foreign substance 600 is small, an amount of the first organic film 312 attached onto the inclined surface of the first inorganic film 310 is small, and it is removed by the ashing.

The second inorganic film 314 is formed so as to cover the first inorganic film 310. The second organic film 316 is formed at the end of the inclined surface formed on the second inorganic film 314. Specifically, the second organic film 316 is formed at the end of the inclined surface formed on the second inorganic film 314 due to the foreign substance 600 to have a thickness around 90 nm.

In the step of ashing the second organic film 316, ashing is performed so as to chip away the thinly formed second organic film 316. Here, the second organic film 316 formed on the planar part is removed by the ashing, but the second organic film 316 formed at the end of the inclined surface of the second inorganic film 314 is left, and therefore the base of the third inorganic film 318 is substantially planarized.

The third inorganic film 318 is formed so as to cover the second inorganic film 314 and the second organic film 316. Specifically, since the base of the third inorganic film 318 is gently inclined due to the second organic film 316, the third inorganic film 318 is formed to be substantially planarized.

As seen above, even in the case where foreign substances 600 of different sizes exist, and a bump due to a large foreign substance 600 is made to be gently inclined by the first organic film 312, and a bump due to a small foreign substance 600 is made to be gently inclined by the second organic film 316. Therefore, a generation of a defect on the second inorganic film 314 or the third inorganic film 318 can be prevented.

While there have been described what are at present considered to be certain embodiments of the invention, it will be understood that various modifications may be made thereto, and it is intended that the appended claims cover all such modifications as fall within the true spirit and scope of the invention.

What is claimed is:

1. A method of manufacturing a display device including a plurality of pixels, comprising steps of:
    forming a first inorganic film;
    forming a first organic film so as to cover the first inorganic film;
    removing a part of the first organic film;
    forming a second inorganic film so as to cover the first inorganic film and a region of the first organic film that has not been removed in the step of removing the part of the first organic film;
    forming a second organic film so as to cover the second inorganic film;
    removing a part of the second organic film; and
    forming a third inorganic film so as to cover the second inorganic film and a region of the second organic film that has not been removed in the step of removing the part of the second organic film,
    wherein a thickness of the first organic film is different from that of the second organic film.

2. The method of manufacturing a display device according to claim 1, further comprising a step of forming a rib at a peripheral part of the pixels,
    wherein the first inorganic film is formed over the rib.

3. The method of manufacturing a display device according to claim 1,
    wherein one of the first organic film and the second organic film is formed to have a thickness of 70 nm to 500 nm, and the other one is formed to have a thickness of 0.8 μm to 3.0 μm.

4. The method of manufacturing a display device according to claim 2,
    wherein the first organic film is formed to be thinner than a thickness of the rib,
    the second organic film is formed to be planarized by filling a convex part constituted by a horizontal surface and an inclined surface of the second inorganic film, and
    the part of the second organic film is removed so that an upper surface of the second organic film is positioned lower than a top surface of the second inorganic film over a top surface of the rib.

5. The method of manufacturing a display device according to claim 2,
    wherein the first organic film is formed to planarize a concave part constituted by a horizontal surface and an inclined surface of the first inorganic film by filling it,
    the part of the first organic film is removed so that an upper surface of the first organic film is positioned lower than that of the first inorganic film over a top surface of the rib, and
    the second organic film is formed to be thinner than a thickness of the rib.

6. The method of manufacturing a display device according to claim 1,
    wherein the step of removing the part of the first organic film or the step of removing the part of the second organic film is performed so as to comprise ashing.

* * * * *